United States Patent
Liu et al.

(10) Patent No.: US 6,222,201 B1
(45) Date of Patent: Apr. 24, 2001

(54) METHOD OF FORMING A NOVEL SELF-ALIGNED OFFSET THIN FILM TRANSISTOR AND THE STRUCTURE OF THE SAME

(75) Inventors: Chia-Chen Liu, Hsinchu; Ching-Nan Yang, Hsinchu Hsien, both of (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/358,762

(22) Filed: Jul. 22, 1999

(51) Int. Cl.$^7$ .......................... H01L 21/00; H01L 21/84; H01L 29/76
(52) U.S. Cl. .......................... 257/49; 438/156; 438/158; 438/173; 438/175; 438/268; 438/270; 438/282; 257/51; 257/66; 257/328; 257/329; 257/330
(58) Field of Search .......................... 438/158, 163, 438/162, 156, 173, 192, 212, 268, 269, 270, 282, 290, 291, 175; 257/329, 328, 330, 51, 66

(56) References Cited

U.S. PATENT DOCUMENTS

| | | | |
|---|---|---|---|
| 5,001,540 | | 3/1991 | Ishihara ................................ 257/329 |
| 5,391,505 | * | 2/1995 | Kapoor ................................ 438/152 |
| 5,403,761 | * | 4/1995 | Rha ...................................... 438/158 |
| 5,459,088 | * | 10/1995 | Rha et al. ............................ 438/158 |
| 5,521,117 | * | 5/1996 | Kapoor ................................ 438/155 |
| 5,523,600 | * | 6/1996 | Kapoor ................................ 257/330 |
| 5,574,294 | | 11/1996 | Shepard ................................ 257/66 |
| 5,668,391 | * | 9/1997 | Kim et al. ............................ 257/328 |
| 5,937,283 | * | 8/1999 | Lee ...................................... 438/149 |
| 5,952,677 | * | 9/1999 | Park .................................... 257/66 |
| 6,008,505 | * | 12/1999 | Cho ...................................... 257/66 |
| 6,033,941 | * | 3/2000 | Yang .................................... 438/163 |
| 6,107,660 | * | 8/2000 | Yang et al. .......................... 257/329 |

* cited by examiner

Primary Examiner—Eddie C. Lee
Assistant Examiner—José R. Díaz

(57) ABSTRACT

The method includes patterning a first polysilicon layer on a substrate. A first dielectric having a first via hole is defined over the substrate. A second polysilicon layer is formed along the surface of the first dielectric layer and refilled into the first via hole. Then, an etching is used to etch the layer. A residual portion of the layer is located at the lower portion of the first via hole. An undoped polysilicon is then patterned on the first dielectric layer and along the surface of the first via hole. An isolation structure is then refilled into the first via hole. An oxide layer is formed on the first polysilicon, the first dielectric layer and the upper surface of isolation structure to act as the gate oxide of the TFT. Then, the oxide and the first dielectric layer are etched to define a second via hole. A further polysilicon layer is pattern on the first dielectric layer and refilled into the second via hole for defining the gate. Then, an ion implantation is employed to dope conductive species into the undoped polysilicon layer uncovered by the gate structure, thereby forming the doped region to act as source or drain. An isolation layer is deposited and a third via hole is generated in the isolation layer. A further polysilicon is then patterned on the second dielectric layer.

13 Claims, 9 Drawing Sheets

METHOD OF FORMING A NOVEL SELF-ALIGNED OFFSET THIN FILM TRANSISTOR AND THE STRUCTURE OF THE SAME

FIELD OF INVENTION

The present invention relates to semiconductor devices, and more specifically, to a method of manufacturing of a thin film transistor with self-aligned offset and the structure of the same.

BACKGROUND

Thin film transistor (TFT) is a kind of a field effect transistor (FET). In typical FET, the source and drain and the channel region are formed in the substrate composed of single crystal silicon. The channel region of the TFT is different from the conventional FET. Namely, the channel region of the TFT is formed in a polysilicon or amorphous silicon layer on a substrate. For the application, the TFT can region of the TFT is formed in a polysilicon or amorphous silicon layer on a substrate. For the application, the TFT can be used in flat panel display as switching transistors and in static random access memory as load devices. By varying the transverse electrical field, it is possible to control the current flow by modulating the conductance of the channel. If the drain bias is applied such that source and drain remain reverse-bias. A positive bias is applied to the gate of the NMOS, electrons will be attracted to the channel region, once enough electrons are drawn into the channel region by the positive gate voltage, and the channel connects the source and the drain.

One of the key parameters to determine the performance of the device is the drain off-set structure. The off-set structure is parts outside the gate electrode. The function of the off-set structure is similar to the lightly doped drain (LDD) structure in FET. The drain off-set structure can reduce the short channel effect or reduce punch-through effect caused by hot carrier and the structure also reduces the off-state leakage. Apparently, one way to form a quality SRAM is to decrease the on off-current and increase the on-current.

FIG. 11 shows a cross sectional view of a conventional polysilicon PMOS cell. In the cell, isolation structures composed of oxide 4a are formed in the substrate 2a for isolation. A driver NMOS is formed on the top of the substrate 2a. A transistor 8a is located adjacent to the NMOS. A gate 10a isolated by dielectric material 6a is formed on the driver NMOS, and a polysilicon layer 10a is used to connect the driver NMOS and the doped region of the transistor 8a. The gate 10a and the polysilicon layer 10a are composed of N type polysilicon. A P conductive type polysilicon layer 12a goes over the dielectric layer 6a. A part of the layer 12a is implanted to define the source and drain. An off-set can be found adjacent to the drain. The separation between the source and drain defines the channel. The channel is oriented in a direction substantially parallel to the substrate, this leads to the conventional structure occupies a large cell area. It is not suitable to the trend of manufacture with high packing density. The channel formed of polysilicon provides smaller on-current compared to monocrystalline silicon channel.

One of the approaches for the off- set structure is disclosed in U.S. Pat. No. 5,001,540 to Ishihara, he develops a dual gate TFT with off-set structure. The off-set region is the extension of a layer used to form the channel region. The dopant concentration is the same with that of channel region. Further, in the structure, the dimension of the off-set is determined by the width of the side walls spacers. Shepard provides a vertical dual gate thin film transistor, the article can be seen in U.S. Pat. No. 5,574,294. Shepard disclosed a self-aligned process for forming the source and drain regions in a dual gate TFT and further allows for the formation of off-set. Recently, some researches and developments have been approached to develop a vertical thin film transistor. The channel of the device is vertical to the surface of the substrate. Some arts provide a device cell with source, channel and drain that are vertically formed in a trench. The devices provide an advantage of higher density than others.

SUMMARY

An object of the present invention is to provide a thin film transistor (TFT) with a self-aligned offset structure.

A first polysilicon layer is deposited by chemical vapor deposition (CVD) on the substrate. Then, the doped polysilicon layer is patterned on the substrate. Side wall spacers are created on the side walls of the previous polysilicon pattern.

A first dielectric having a first via hole is defined over the substrate. The first dielectric layer can be formed of oxide layer by using a chemical vapor deposition process, with a tetraethylorthosilicate (TEOS) source, at a temperature between about 600 to 800 degrees centigrade. A second doped polysilicon layer is formed along the surface of the first dielectric layer. The doped polysilicon layer is also refilled into the first via hole and then performing an etching process to etch the polysilicon layer. A residual portion of the layer is located at the lower portion of the first via hole. An off-set structure can be controlled easily by etching time mode. An undoped polysilicon is then patterned on the first dielectric layer and along the surface of the first via hole. An isolation structure is then refilled into the first via hole. An oxide layer is formed on the first polysilicon, the first dielectric layer and the upper surface of isolation structure to act as the gate oxide of the TFT. Thus, the gate oxide is preferably formed by a so-called high temperature oxide (HTO) procedure. Then, the HTO oxide and the first dielectric layer are etched to define a second via hole.

A further doped polysilicon layer is pattern on the first dielectric layer and refilled into the second via hole for defining the control gate. Then, using the control gate pattern as a mask, an ion implantation is employed to dope conductive species into the undoped polysilicon layer uncovered by the gate structure, thereby forming the doped region to act as source or drain. An isolation layer is deposited and a third via hole is generated in the isolation layer. A further polysilicon is then patterned on the second dielectric layer.

The vertical thin film transistor includes a conductive structure formed on the substrate. A first isolation layer is formed on the conductive structure and the substrate. The first isolation layer includes an opening formed therein. A first doped region (drain or source) is located at the lower portion of the opening. A channel region is formed along at least one of the side-wall of the opening and extends outside the opening to a portion of the upper surface of the dielectric layer. An isolation structure fills in the opening. Gate oxide is formed on the channel region. A gate is patterned on the undoped polysilicon and adjacent to the opening. A second doped region is formed adjacent to the channel region connected to the channel region. A second opening is formed in the first dielectric layer adjacent to the TFT to expose the conductive structure. A conductive structure is formed in the second opening. A second dielectric layer having a third opening is formed on the TFT and the conductive structure. A third conductive structure is formed on the second dielectric layer and in the third opening.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A to FIG. 9A are cross sectional views of a second embodiment according to the present invention.

DETAILED DESCRIPTION

The present invention proposes a novel method and a novel structure to fabricate a high-density thin film transistor (TFT) with vertical channel region and with a self-aligned offset structure. A dimension of the offset structure can be easily controlled by an etching back process. The TFT can be used in flat panel display as switching transistors and in static random access memory as load devices. Under this structure, the device can reduce the punch-through effect and the off-state leakage. Hereinafter, the preferred embodiment of the present invention will be described with reference to accompanying drawing. The detailed description can be seen as follows.

Figure 1:
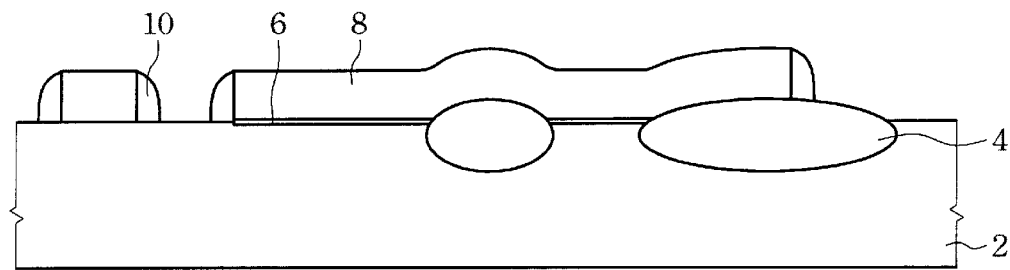
FIG. 1 is a cross sectional view of a semiconductor substrate illustrating the steps of forming a first polysilicon pattern on a semiconductor substrate according to the present invention.

Referring to FIG. 1, any suitable semiconductor material is provided as a substrate. For example, a single crystal substrate 2 with a <100> crystallographic orientation is used for the preferred embodiment. Other type substrate may be used. In this embodiment, the substrate 2 is provided, a plurality of isolation structures such as field oxide (FOX) regions 4 are created for the purposes of defining the active area (AA). Typically, the FOX regions 4 are created via a photoresist and dry etching to define a silicon nitride-silicon dioxide composite layer. After the photoresist is removed and wet clean process, thermal oxidation in an oxygen ambient is performed to form the FOX regions 4, to a thickness of bout 3000–8000 angstroms. The silicon nitride layer is then typically removed using hot phosphoric acid solution while the silicon dioxide is removed by using diluted HF or BOE solution. Alternatively, an isolation structure formed by shallow trench isolation technique can be used.

Successively, buried contact area (BC) 6 is formed by well known technique on the substrate 2. Then, a doped polysilicon layers 8 is deposited by chemical vapor deposition (CVD) on the substrate 2. Then, the doped polysilicon layer 8 is patterned on the substrate 2 to have a desired pattern including a word line formed adjacent to a conductive structure. The doped polysilicon layer 8 can be formed by performing an ion implantation after the layer is deposited or by in-situ deposition technique. Wherein the doped polysilicon layer 8 is formed to have a concentration of dopants of about 1E20 to 3E20 atoms/cm$^3$.

Subsequently, side wall spacers 10 are created on the side walls of the previous polysilicon pattern 8. This can be formed by depositing a dielectric layer on the patterned polysilicon 8 and followed by etching the dielectric layer thereby forming the aforesaid side wall spacers 10. In an embodiment, the side wall spacers 10 are composed of silicon oxide, silicon nitride or the like. If the spacers 10 are formed of oxide, then the oxide can be formed by a low temperature CVD, such as plasma enhanced CVD, on the feature using silane as a precursor. Alternatively, the oxide may be formed using other known oxide chemical compositions and procedures. For example, the oxide layer can be silicon dioxide formed using a chemical vapor deposition process, with a tetraethylorthosilicate (TEOS) source, at a temperature between about 600 to 800 degrees centigrade and a pressure of about 0.1 to 10 torr. Typically, the silicon nitride material can be deposited by low pressure chemical vapor deposition (LPCVD), plasma enhanced chemical vapor deposition (PECVD), or high density plasma chemical vapor deposition (HDPCVD) may be used. In the preferred embodiment, the reaction gases used to form the silicon nitride includes $SiH_4$, $NH_3$, $N_2$, $N_2O$ or $SiH_2Cl_2$, $NH_3$, $N_2$, $N_2O$.

Figure 2:
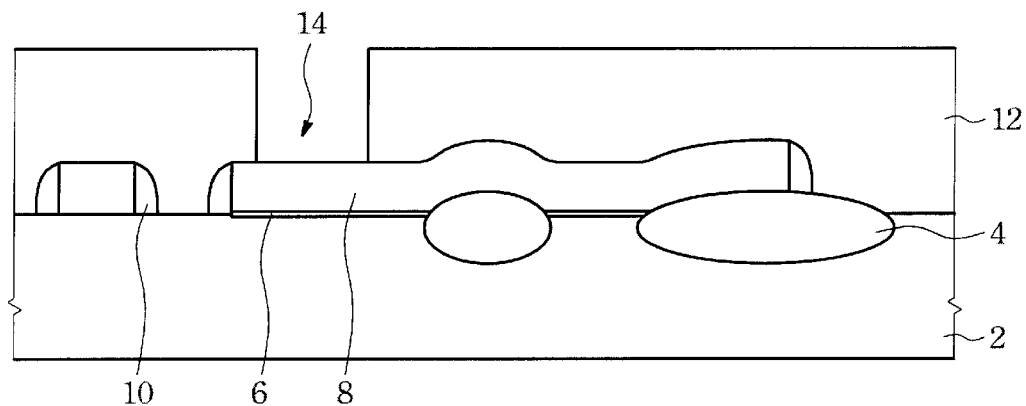
FIG. 2 is a cross sectional view of a semiconductor substrate illustrating the steps of forming a first dielectric layer on a semiconductor substrate according to the present invention.
Figure 3:
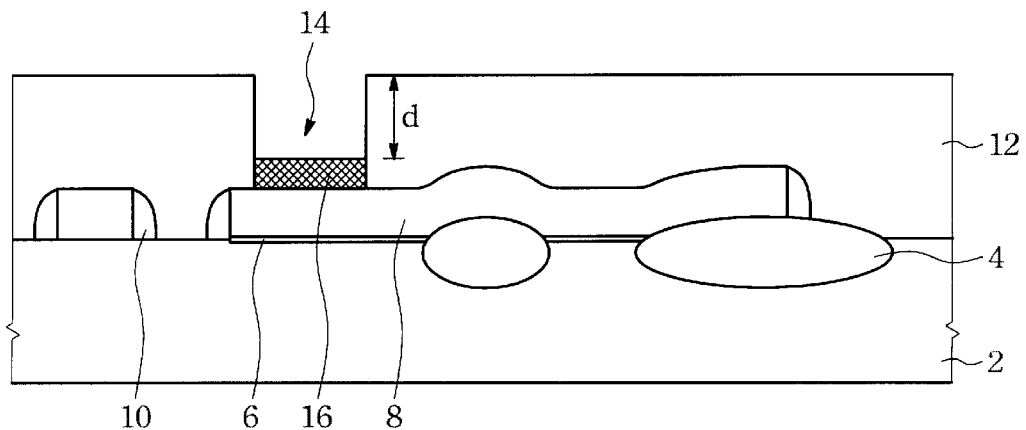
FIG. 3 is a cross sectional view of a semiconductor substrate illustrating the steps of forming a first doped region in a first via hole of the first dielectric layer according to the present invention.

Referring to FIG. 2, a first dielectric 12 having a via hole 14 aligned to a portion of the conductive structure of the polysilicon pattern 8 is defined over the substrate 2. The first dielectric layer 12 can be formed of oxide layer by using a chemical vapor deposition process, with a tetraethylorthosilicate (TEO S) source, at a temperature between about 600 to 800 degrees centigrade. Turning to FIG. 3, a second doped polysilicon layer 16 is formed along the surface of the first dielectric layer 12. Similarly, using aforementioned method, material or other well-known technology can form the second polysilicon layer 16. Thus, the description is omitted. The concentration of dopants of the second doped polysilicon layer 16 is about 1E20 to 3E20 atoms/cm$^3$. The doped polysilicon layer 16 is also refilled into the via hole 14 and then performing an etching process to etch the polysilicon layer 16. A residual portion of the layer 16 is located at the lower portion of the via hole 14. The residual portion 16 contacts with the first polysilicon layer 8 and acts as a doped region (source or drain) of the TFT. Preferably, the doped polysilicon 16 includes dopants with P conductive type ions. This can be formed by an ion implantation or in-situ deposition technique. If the area 16 acts as a drain, an off-set structure indicated by "d" can be controlled easily by etching time mode such that the dimension from the surface of the first dielectric layer 12 to the one of the layer 16 can be controlled precisely.

Figure 4:
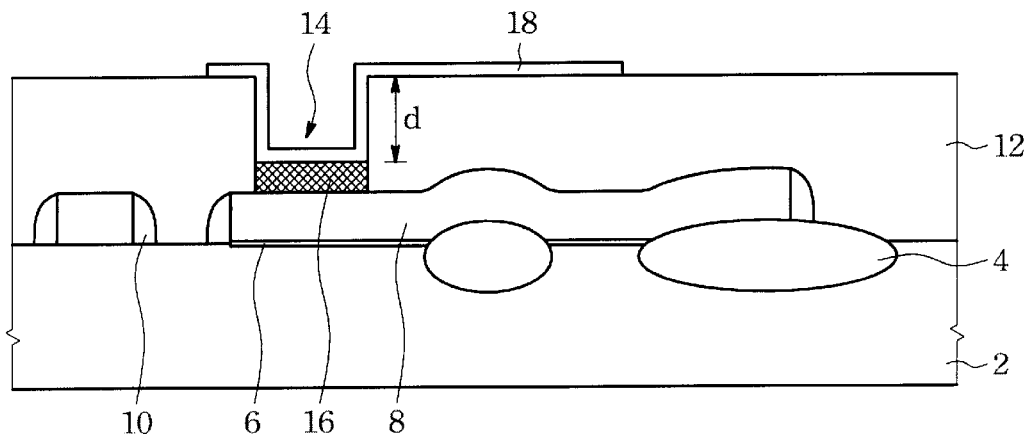
FIG. 4 is a cross sectional view of a semiconductor substrate illustrating the step of forming a TFT body according to the present invention.
Figure 5:
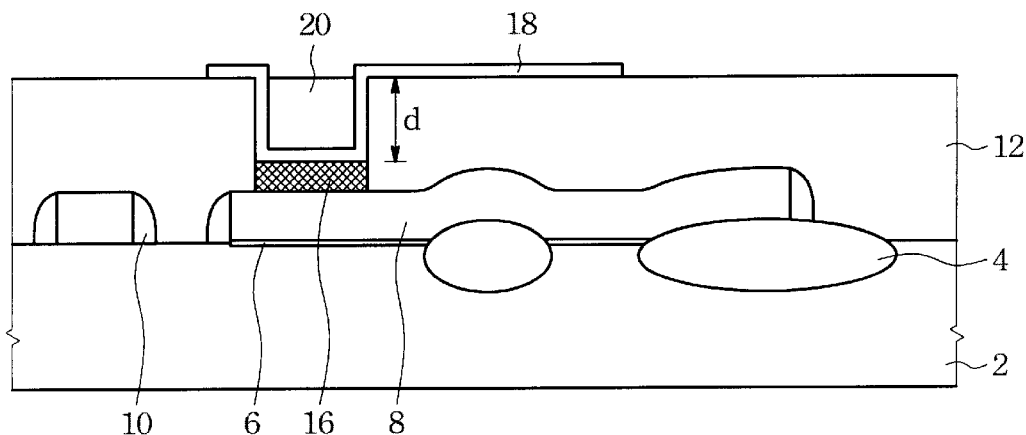
FIG. 5 is a cross sectional view of a semiconductor substrate illustrating the step of forming an oxide in the first via hole according to the present invention.
Figure 6:
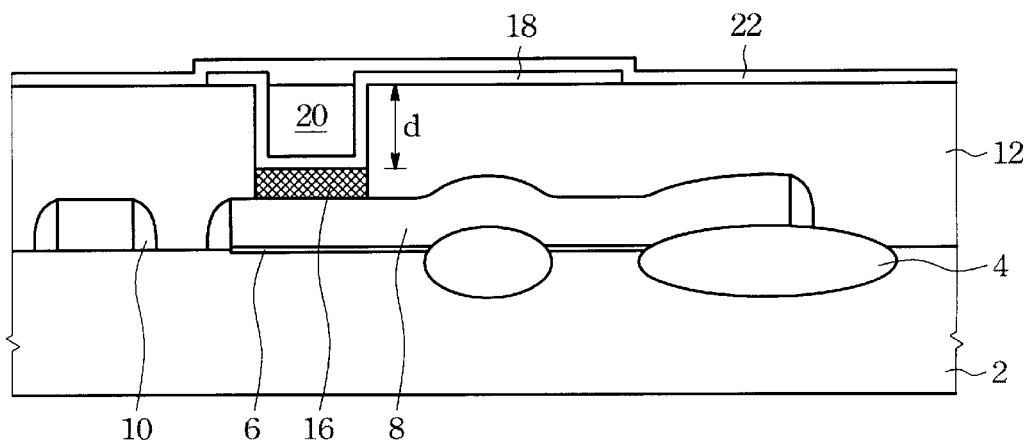
FIG. 6 is a cross sectional view of a semiconductor substrate illustrating the step of forming gate oxide according to the present invention.

An undoped polysilicon 18 that serves as the body of the TFT is then patterned on the first dielectric layer 12 and along the surface of the first via hole 14, as shown in FIG. 4. Next step is to refill an isolation structure 20 into the first via hole 14. This can be achieved by depositing an oxide, followed by etching back this layer, as shown in FIG. 5 and FIG. 6 depicts the formation of an oxide layer 22 on the polysilicon 18, the first dielectric layer 12 and the upper surface of isolation structure 20. The oxide 22 acts the gate oxide of the TFT. Thus, the gate oxide 22 is preferably formed by a so-called high temperature oxide (HTO) procedure. The temperature for forming the HTO oxide is about 650 to 750 centigrade degrees. The thickness of the oxide is from about 100 to 400 angstroms. Turning to FIG. 7, the HTO oxide 22 and the first dielectric layer 12 are etched to define a second via hole 26, thereby exposing a terminal of the conductive structure 8.

Figure 8:
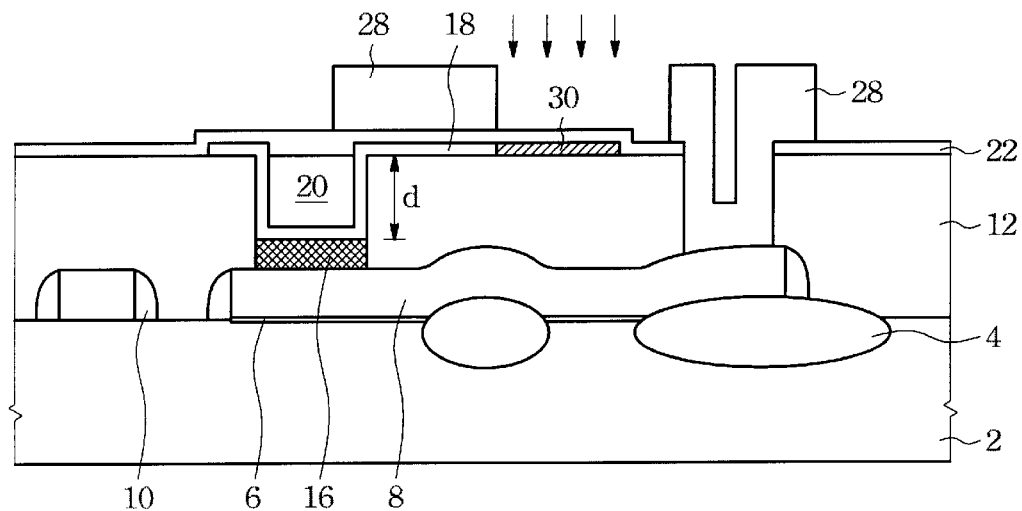
FIG. 8 is a cross sectional view of a semiconductor substrate illustrating the step of forming a control gate according to the present invention.

Now referring to FIG. 8, a doped polysilicon layer 28 is deposited on the first dielectric layer 12 and refilled into the via hole 26. An etching back is carried out to etch the layer 28 for defining the control gate pattern adjacent to the opening of the first via hole 14, and a separated portion in the second via hole 26 to act as an electrical connection structure. Then, using the control gate pattern as a mask, an ion implantation is employed to dope conductive species into the undoped polysilicon layer 18 uncovered by the gate structure 28. The step leads to the formation of the second doped region 30 to act as source or drain.

Figure 9A:
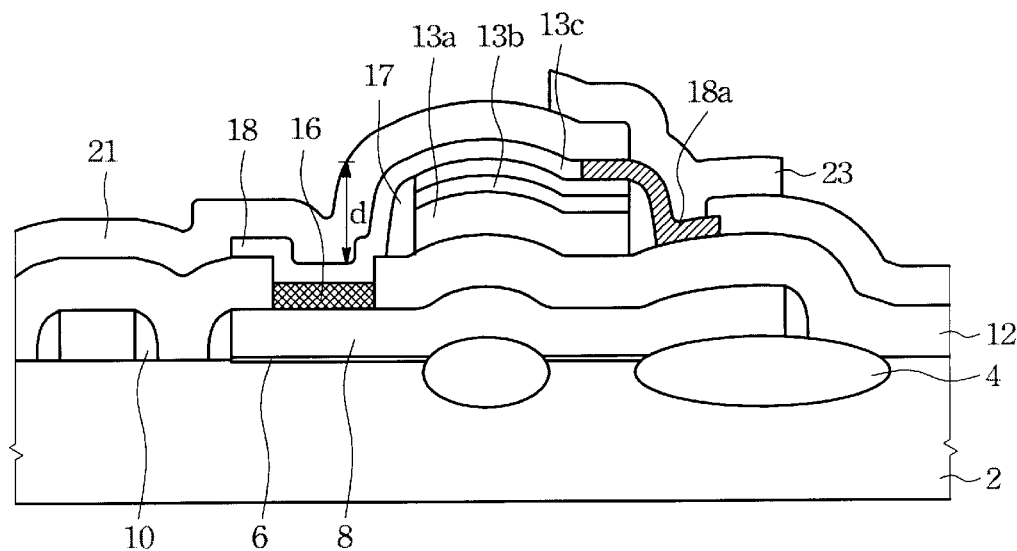
Figure 9:
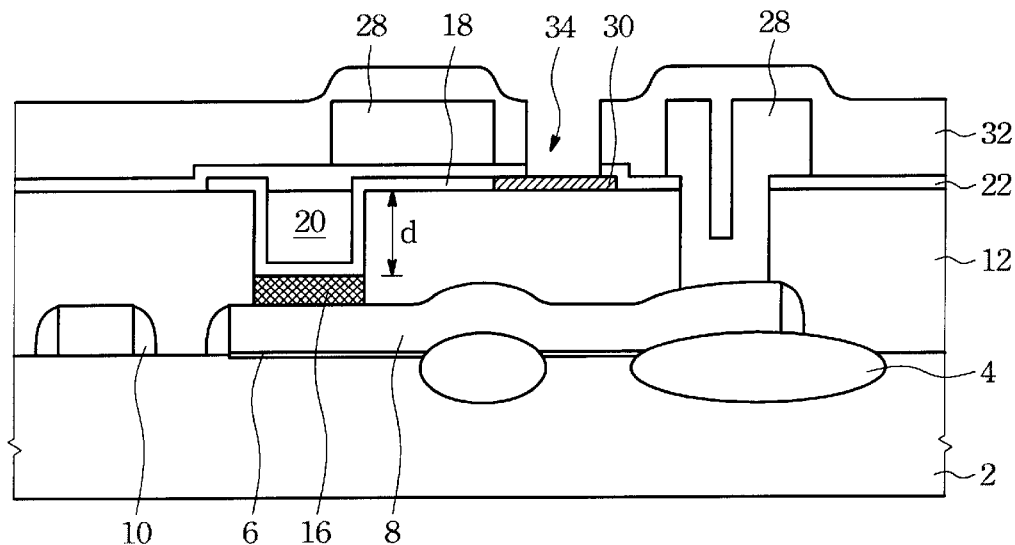
FIG. 9 is a cross sectional view of a semiconductor substrate illustrating the step of forming a second dielectric layer according to the present invention.

Turning to FIG. 9, an isolation layer 32 consisted of dielectric layer is deposited over the feature after the formation of the TFT. A third via hole 34 is generated in the isolation layer 32 by using well known lithography and etching techniques. The via hole 34 provide electrical connection paths to reach those regions.

A further polysilicon 36 is patterned on the surface of the second dielectric layer 32 and contacts with the source or drain 30 of the TFT. The concentration of dopants of the doped polysilicon layer 36 is about 1E20 to 3E20 atoms/cm$^3$. In the operation, a bias Vcc may be applied to the polysilicon layer 36.

Figure 10:
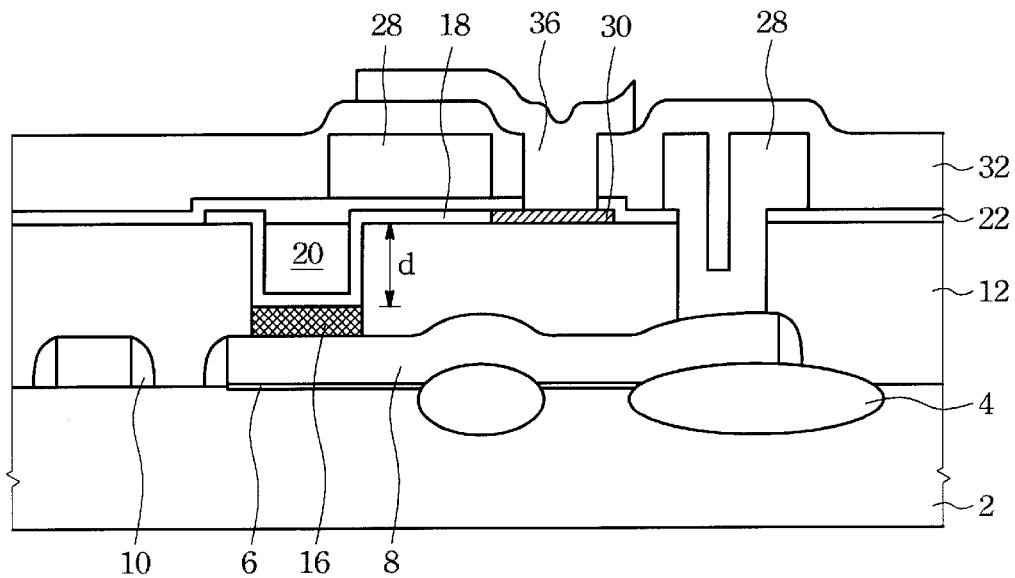
FIG. 10 is a cross sectional view of a semiconductor substrate illustrating the step of forming a further polysilicon pattern according to the present invention.
Figure 11:
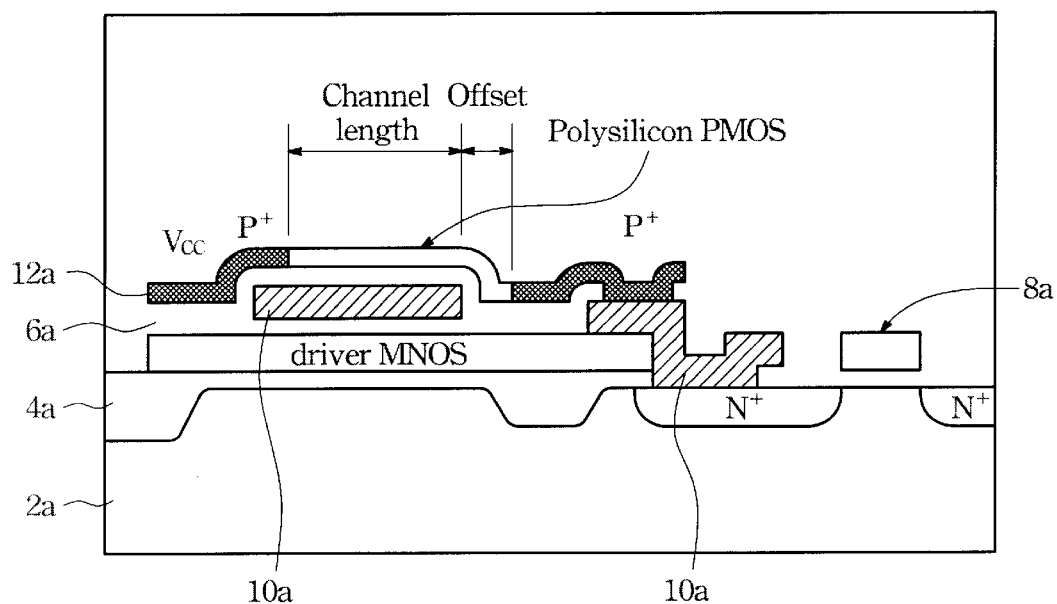
FIG. 11 is a cross sectional view of a semiconductor substrate illustrating a structure of a TFT according to the prior art.

The vertical thin film transistor in accordance with the present invention is depicted in FIG. 10. The cell includes a conductive structure 8 formed on the substrate 2. A first isolation layer 12 is formed on the conductive structure 8 and the substrate 2. The first isolation layer includes an opening 14 formed therein. A first doped region (drain or source) 16 is located at the lower portion of the opening 14. A channel region 18 lying along at least one of the side-wall of the opening 14 and extends outside the opening 14 to a portion of the upper surface of the dielectric layer 12. An isolation structure 20 fills in the opening 14. Gate oxide 22 is formed on the channel region 18. A gate 28 is patterned on the undoped polysilicon 18 and adjacent to the opening 14. A second doped region 30 is formed adjacent to the channel region 18 connected to the channel region 18. A second opening 26 is formed in the first dielectric layer 12 adjacent to the TFT to expose the conductive structure 8. A conductive structure 28 is formed in the second opening 26. A second dielectric layer 32 having a third opening 34 is formed on the TFT and the conductive structure 28. A third conductive structure 36 is formed on the second dielectric layer 32 and in the third opening 34.

Figure 1A:
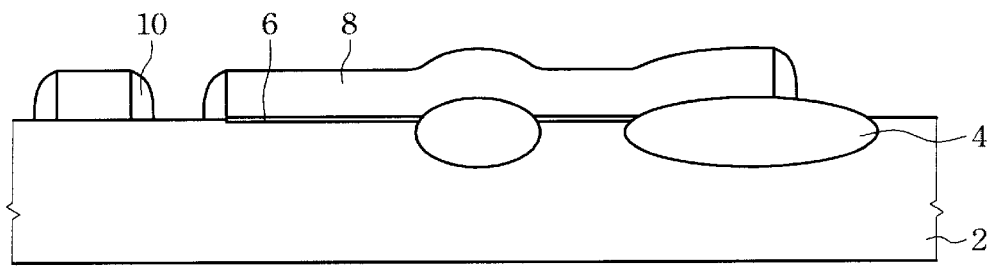

A further embodiment is described as follows. Referring to FIG. 1A, similarly, the substrate 2 includes a plurality of isolation structures formed thereon for the purposes of defining the active area (AA) and the buried contact area (BC) 6 formed on the substrate 2. The doped polysilicon pattern 8 including a word line formed adjacent to a conductive structure and side wall spacers 10 are formed on the substrate 2.

Figure 2A:
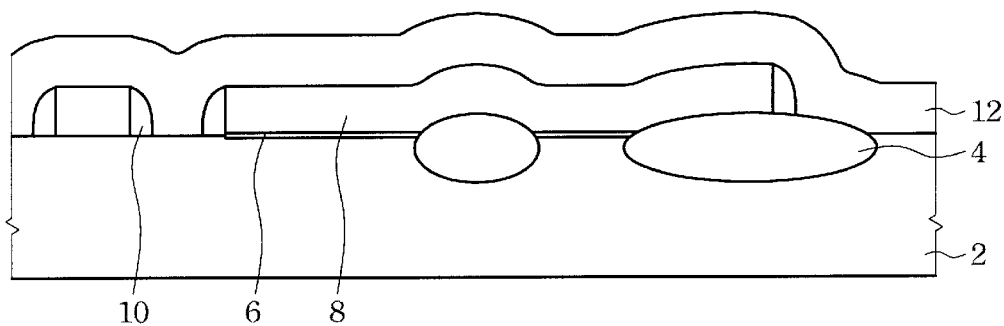
Figure 3A:
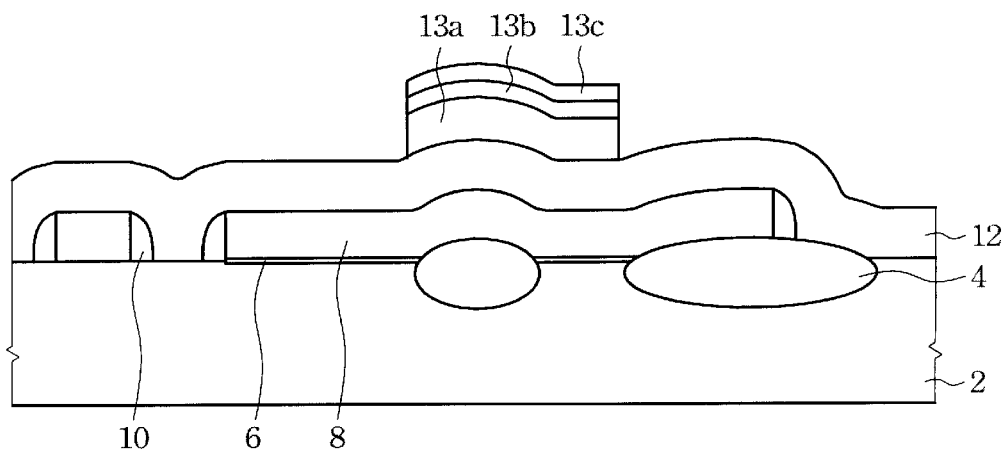
Figure 4A:
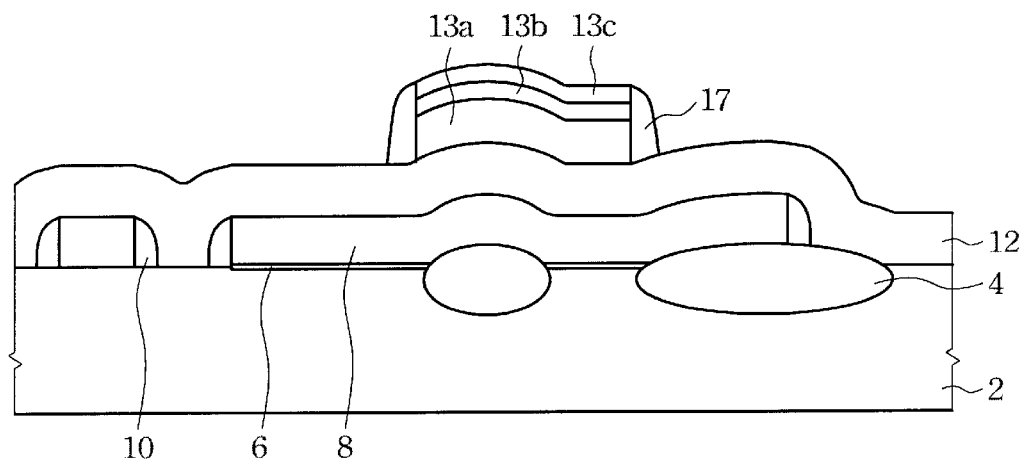

Referring to FIG. 2A, a first dielectric 12 is deposited over the substrate 2. The first dielectric layer 12 can be formed of oxide layer by using a chemical vapor deposition process, with a tetraethylorthosilicate (TEOS) source, at a temperature between about 600 to 800 degrees centigrade. Turning to FIG. 3A, a multi-layer structure including doped polysilicon layer 13a, high temperature oxide (HTO) layer 13b and nitride layer 13c is patterned on the surface of the first dielectric layer 12. The polysilicon layer 13a are used as the TFT gate, and the HTO/nitride layers 13b, 13c acts as the gate dielectric. Then, side wall spacers 17 are formed on the side walls of the multi-layers structure for isolation. This can be achieved by depositing a dielectric layer, followed by etching, as shown in FIG. 4A.

Figure 5A:
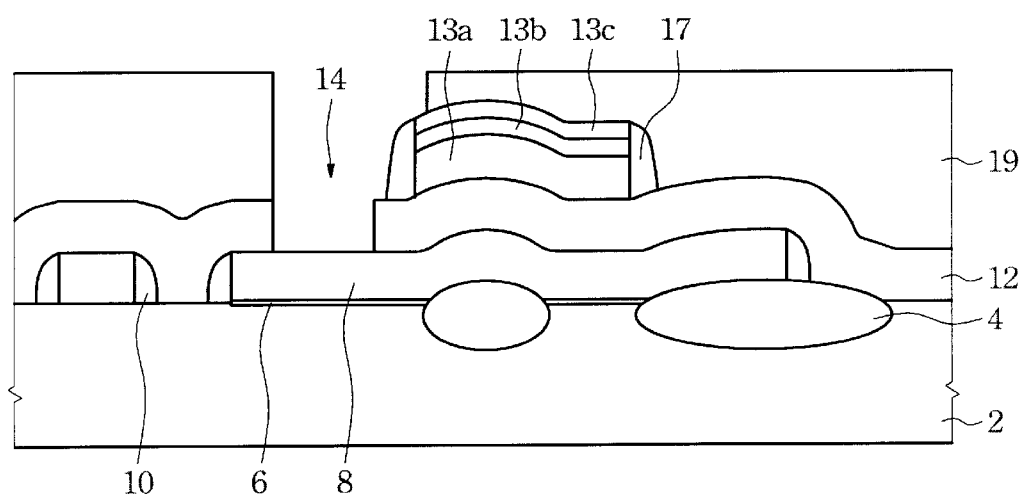
Figure 6A:
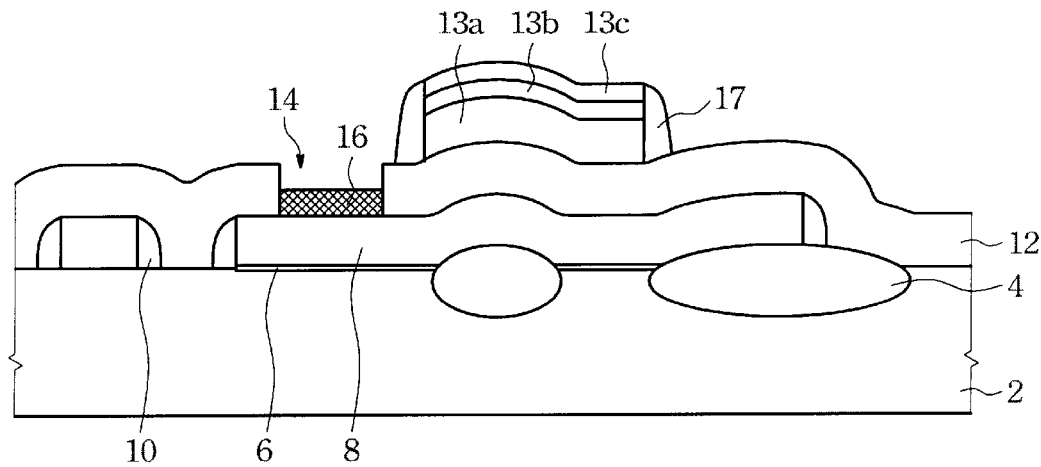

Turning to FIG. 5A, a photoresist 19 having a opening is patterned on the multi-layer structure and the dielectric layer 12. Then, an etching process is used to etch the dielectric layer to generate a hole 14 in the dielectric layer 12 adjacent to the multi-layer structure. Then, the photoresist 19 is stripped by conventional manner. Subsequently, a doped polysilicon layer is formed on the multi-layer structure and the dielectric layer and refilled in the hole 14. The next step is to perform an etch step to attack the polysilicon. As shown in FIG. 6A, a residual portion of the polysilicon layer 16 is located at the lower portion of the hole 14. The residual portion 16 contacts with the first polysilicon layer 8 and acts as a doped region (source or drain) of the TFT. Preferably, the doped polysilicon 16 includes dopants with P conductive type ions. This can be formed by an ion implantation or in-situ deposition technique. If the area 16 acts as a drain, an off-set structure indicated by"d" (FIG. 9A) can be controlled easily by etching time mode such that the dimension from the surface of the first dielectric layer 12 to the one of the layer 16 can be controlled precisely.

Figure 7A:
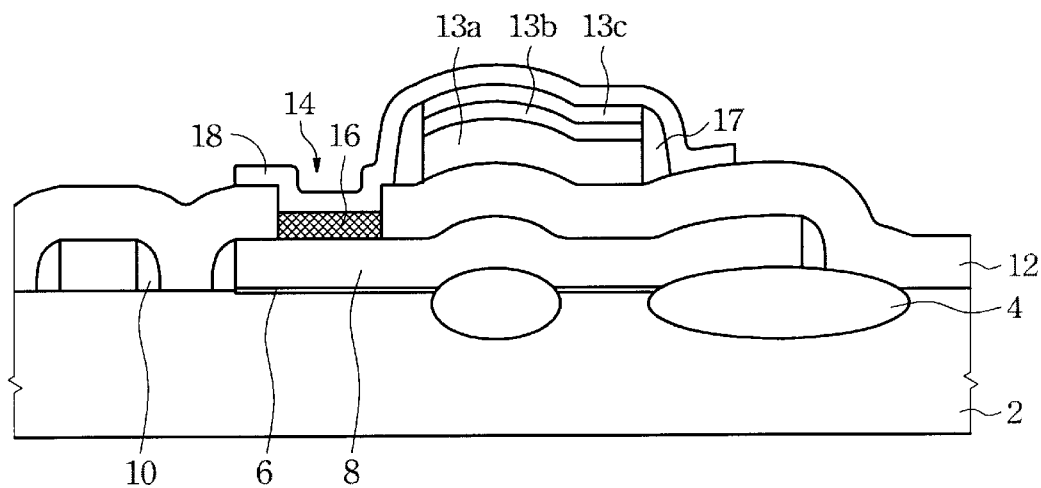
FIG. 7 is a cross sectional view of a semiconductor substrate illustrating the steps of forming a second via hole in the first dielectric layer according to the present invention.
Figure 7:
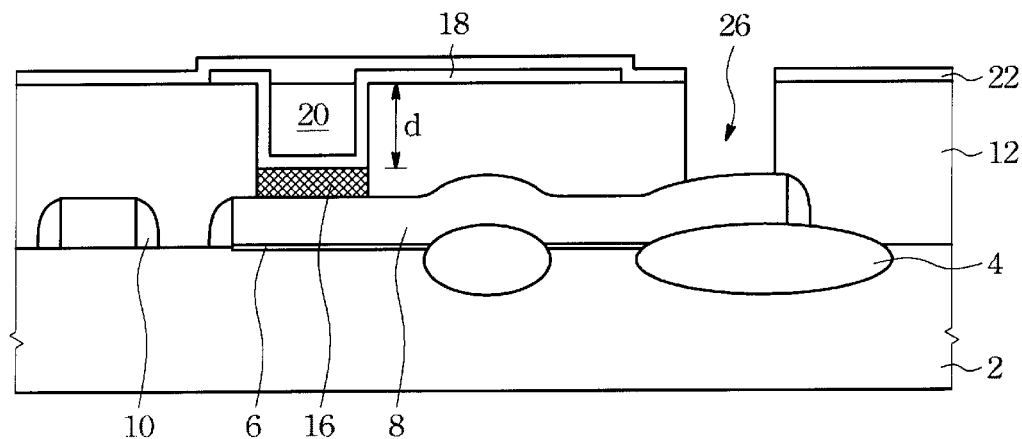
Figure 8A:
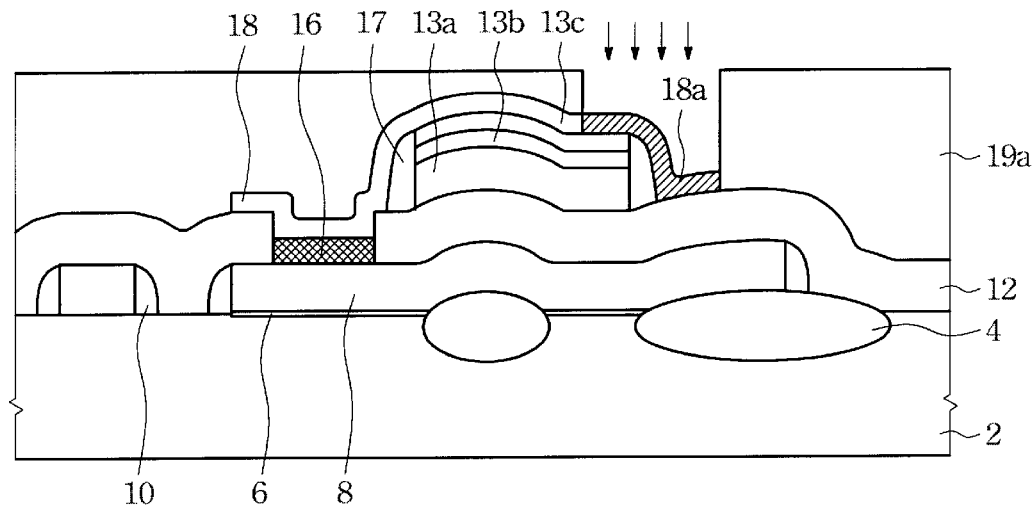

Turning to FIG. 7A, an undoped polysilicon 18 that serves as the body of the TFT is then patterned on the first dielectric layer 12, along the surface of the hole 14 and on the multi-layer structure. Then, a photoresist 19a is patterned over the substrate 2 to expose a portion of the polysilicon layer 18. Then, an ion implantation is used to implant ions into the exposed portion, thereby generating the drain or source region 18a. The photoresist 19a is then removed as illustrated in FIG. 8A. Next step is to form an isolation layer on the TFT and on the dielectric layer 12. Turning to FIG. 9A, the isolation layer 21 consisted of dielectric layer is deposited over the feature after the formation of the TFT. A hole is generated in the isolation layer 21 to expose a portion of the doped region 18a by using well known lithography and etching techniques. The hole provides electrical connection paths to reach those A further polysilicon 23 is patterned on the surface of the layer 21 and contacts with the source or drain 18a of the TFT. The concentration of dopants of the doped polysilicon layer 23 is about 1E20 to 3E20 atoms/cm$^3$. In the operation, a bias Vcc may be applied to the polysilicon layer 23.

The thin film transistor in accordance with the present invention is depicted in FIG. 9A. The cell includes a conductive structure 8 formed on the substrate 2. A first isolation layer 12 is formed on the conductive structure 8 and the substrate 2. The first isolation layer includes an opening 14 formed therein. A first doped region (drain or source) 16 is located at the lower portion of the opening 14. A gate structure including gate oxide is formed on the dielectric layer 12 adjacent to the hole 14. A channel region 18 lying along at least one of the side-wall of the hole 14 and extends outside to a portion of the upper surface of the gate structure. A second doped region 18a is formed adjacent to the channel region 18 and is connected to the channel region 18. A further dielectric layer 21 is formed on the gate structure and the channel region 18 of the TFT. A second hole is formed in the dielectric layer 21 adjacent to the TFT. A conductive structure 23 is formed in the second hole.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a thin film transistor on a substrate, the method comprising:

patterning a first doped silicon layer on said substrate;

forming a first dielectric layer on said first doped silicon layer and said substrate;

forming a first via hole in said first dielectric layer;

forming a second doped silicon layer in said first via hole;

etching back said second doped silicon layer to a depth to act as a first doped region;

forming an undoped silicon layer on at least one side wall of said first via hole and extending on a portion of an upper surface of said first dielectric layer to act as a channel region;

refilling an isolation material in said first via hole;

forming a gate oxide layer on said undoped silicon layer, said isolation material and on said first dielectric layer;

forming a gate pattern on said gate oxide layer; and performing an ion implantation to form a second doped region in said undoped silicon layer uncovered by said gate pattern to act as a second doped region.

2. The method of claim 1, further comprising forming a second via hole in said first dielectric layer to expose said first silicon layer after forming said gate oxide.

3. The method of claim 2, further comprising forming a first conductive structure in said second via hole when forming said gate pattern.

4. The method of claim 1, further comprising performing an ion implantation after forming said first doped region.

5. The method of claim 1, further comprising following steps after forming said gate pattern;

forming a second dielectric layer on said gate pattern and said gate oxide;

forming a third via hole in said second dielectric layer; and forming a second conductive structure in said third via hole.

6. The method of claim 5, wherein said second dielectric layer comprises oxide.

7. The method of claim 1, wherein said first dielectric layer comprises oxide.

8. The method of claim 1, wherein said first doped region comprises polysilicon.

9. The method of claim 1, wherein said second doped region comprises polysilicon.

10. The method of claim 1, wherein said isolation material comprises oxide.

11. A method of forming a thin film transistor on a substrate, the method comprising:

patterning a first doped silicon layer on said substrate;

forming a first dielectric layer on said first doped silicon layer and said substrate;

patterning a gate structure comprising a gate and a gate dielectric on said first dielectric layer;

forming side wall spacers on side walls of said gate structure;

forming a first hole in said first dielectric layer and adjacent to said gate structure;

forming a second doped silicon layer in said first hole;

etching back said second doped silicon layer to a depth to act as a first doped region;

patterning an undoped silicon layer on at least one side wall of said first hole and extending to an upper surface of said gate structure to act as a channel region; and performing an ion implantation to dope ions into a terminal of said channel region to form a second doped region.

12. The method of claim 11, further comprising following steps after forming said second doped region:

forming a second dielectric layer over said substrate; and forming a second hole in said second dielectric layer to expose said first dielectric layer.

13. The method of claim 11, wherein said gate dielectric comprises a HTO oxide and a nitride.

* * * * *